United States Patent
Endo et al.

(10) Patent No.: US 9,750,128 B2
(45) Date of Patent: Aug. 29, 2017

(54) UNIT DEVICE

(71) Applicant: FUJITSU LIMITED, Kawasaki-shi, Kanagawa (JP)

(72) Inventors: Atsushi Endo, Kawasaki (JP); Hideki Kimura, Machida (JP); Katsuhiko Nakata, Kawasaki (JP); Yoichi Sato, Kawasaki (JP); Takashi Urai, Kawasaki (JP); Masahide Kodama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/054,206

(22) Filed: Feb. 26, 2016

(65) Prior Publication Data
US 2016/0270206 A1    Sep. 15, 2016

(30) Foreign Application Priority Data

Mar. 11, 2015    (JP) .................. 2015-048455

(51) Int. Cl.
*H05K 7/20* (2006.01)
*H05K 1/02* (2006.01)

(52) U.S. Cl.
CPC ....... *H05K 1/0203* (2013.01); *H05K 7/20727* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

(Continued)

(56) References Cited

U.S. PATENT DOCUMENTS

2004/0001311 A1* 1/2004 Doblar ................ G06F 1/20
361/679.49
2005/0265003 A1* 12/2005 Coglitore ............. H05K 9/0018
361/724

(Continued)

FOREIGN PATENT DOCUMENTS

EP    2535786 A1    12/2012
JP    06-177566    6/1994

(Continued)

OTHER PUBLICATIONS

Extended European Search Report dated Aug. 2, 2016 for corresponding to European Patent Application No. 16156984.3, 7 pages.

*Primary Examiner* — Anthony Haughton
*Assistant Examiner* — Razmeen Gafur
(74) *Attorney, Agent, or Firm* — Fujitsu Patent Center

(57) ABSTRACT

A disclosed unit device: two first circuit boards provided apart from each other in a horizontal direction; heat generating components respectively provided on the two first circuit boards; two second circuit boards provided between the two first circuit boards, arranged to stand at a distance from each other, and each having an opening; and a fan provided between the two second circuit boards and configured to cool the heat generating components on the two first circuit boards by drawing air through the opening of one of the second circuit boards and by expelling the air through the opening of the other second circuit board.

11 Claims, 14 Drawing Sheets

(58) Field of Classification Search
USPC ...... 361/676–678, 679.46–679.54, 688–723;
165/80.1–80.5, 104.33, 185;
174/15.1–15.3, 16.1–16.3, 547, 548;
257/712–722, E23.088; 24/453, 458–459;
454/184; 312/236
See application file for complete search history.

(56) References Cited

U.S. PATENT DOCUMENTS

| | | | |
|---|---|---|---|
| 2006/0126292 A1* | 6/2006 | Pfahnl | H05K 7/20563 361/695 |
| 2007/0109744 A1 | 5/2007 | Matsushima et al. | |
| 2008/0266792 A1* | 10/2008 | Li | H05K 7/20909 361/695 |
| 2009/0097200 A1* | 4/2009 | Sharma | G06F 1/18 361/688 |
| 2009/0323282 A1* | 12/2009 | Holdredge | H05K 7/20145 361/694 |
| 2010/0265645 A1* | 10/2010 | Wang | G06F 1/181 361/679.4 |
| 2011/0090628 A1* | 4/2011 | Sullivan | G06F 1/16 361/679.02 |
| 2011/0222227 A1* | 9/2011 | Xu | G06F 1/181 361/679.4 |
| 2011/0273840 A1* | 11/2011 | Chen | H05K 7/20727 361/679.48 |
| 2011/0273841 A1* | 11/2011 | Paquin | H05K 7/20727 361/679.48 |
| 2011/0292608 A1* | 12/2011 | Tan | H01L 23/36 361/696 |
| 2011/0304981 A1* | 12/2011 | Huang | G06F 1/20 361/679.48 |
| 2011/0313576 A1* | 12/2011 | Nicewonger | F28D 15/00 700/282 |
| 2012/0033385 A1* | 2/2012 | Nagasawa | H01L 23/427 361/721 |
| 2012/0044644 A1* | 2/2012 | Harlan | F04D 25/166 361/695 |
| 2012/0113592 A1* | 5/2012 | Chen | H05K 7/1488 361/695 |
| 2012/0147549 A1 | 6/2012 | Wu et al. | |
| 2012/0162913 A1* | 6/2012 | Lai | H05K 7/20727 361/695 |
| 2012/0201003 A1* | 8/2012 | Shimasaki | H05K 7/20736 361/695 |
| 2013/0058038 A1* | 3/2013 | Alyaser | F28D 15/00 361/679.53 |
| 2013/0083481 A1* | 4/2013 | Goto | H05K 7/20209 361/695 |
| 2013/0083483 A1* | 4/2013 | Wei | H01L 23/467 361/697 |
| 2013/0128464 A1* | 5/2013 | Chen | H05K 7/026 361/721 |
| 2013/0329364 A1* | 12/2013 | Kameno | H05K 7/20563 361/697 |
| 2014/0029194 A1* | 1/2014 | Hayashi | H05K 7/20136 361/679.48 |
| 2014/0036439 A1* | 2/2014 | Huang | H05K 7/20727 361/692 |
| 2014/0071616 A1* | 3/2014 | Watanabe | H05K 7/20736 361/679.47 |
| 2014/0118937 A1* | 5/2014 | Adrian | H05K 7/20172 361/695 |
| 2014/0233185 A1* | 8/2014 | Wen | H05K 7/20172 361/695 |
| 2014/0307386 A1* | 10/2014 | French, Jr. | G06F 1/16 361/679.58 |
| 2015/0036280 A1 | 2/2015 | Gektin et al. | |

FOREIGN PATENT DOCUMENTS

| | | |
|---|---|---|
| JP | 2007-133712 | 5/2007 |
| WO | 2014/039845 A1 | 3/2014 |

\* cited by examiner

UNIT DEVICE

CROSS-REFERENCE TO RELATED APPLICATION(S)

This application is based upon and claims the benefit of priority of the prior Japanese Patent Application No. 2015-048455, filed on Mar. 11, 2015, the entire contents of which are incorporated herein by reference.

FIELD

The embodiments discussed herein are related to a unit device.

BACKGROUND

A unit device such as a server is provided with a fan for cooling internal heat generating components such as a central processing unit (CPU). An effective way to cool the heat generating components efficiently is to hit most of an airflow created by the fan against the heat generating components.

However, in the unit device, electronic components such as memories and wiring substrates are arranged so densely that it is difficult to hit the airflow against the heat generating components. This problem is particularly remarkable in the case where a plurality of heat generating components is provided in a single unit device.

The techniques related to the present application are disclosed in Japanese Laid-open Patent Publication Nos. 2007-133712 and 06-177566.

SUMMARY

According to one aspect discussed herein, there is provided an unit device including: two first circuit boards provided apart from each other in a horizontal direction; a heat generating component provided on each of the two first circuit boards; two second circuit boards provided between the two first circuit boards, arranged to stand at a distance from each other, and each having an opening; and a fan provided between the two second circuit boards and configured to cool the heat generating components on the two first circuit boards by drawing air through the opening of one of the second circuit boards and by expelling the air through the opening of the other second circuit board.

The object and advantages of the invention will be realized and attained by means of the elements and combinations particularly pointed out in the claim.

It is to be understood that both the forgoing general description and the following detailed description are exemplary and explanatory and are not restrictive of the invention.

DESCRIPTION OF EMBODIMENTS

Prior to discussion of embodiments, description is provided for matters examined by the inventors of the present application.

First Example

Figure 1:
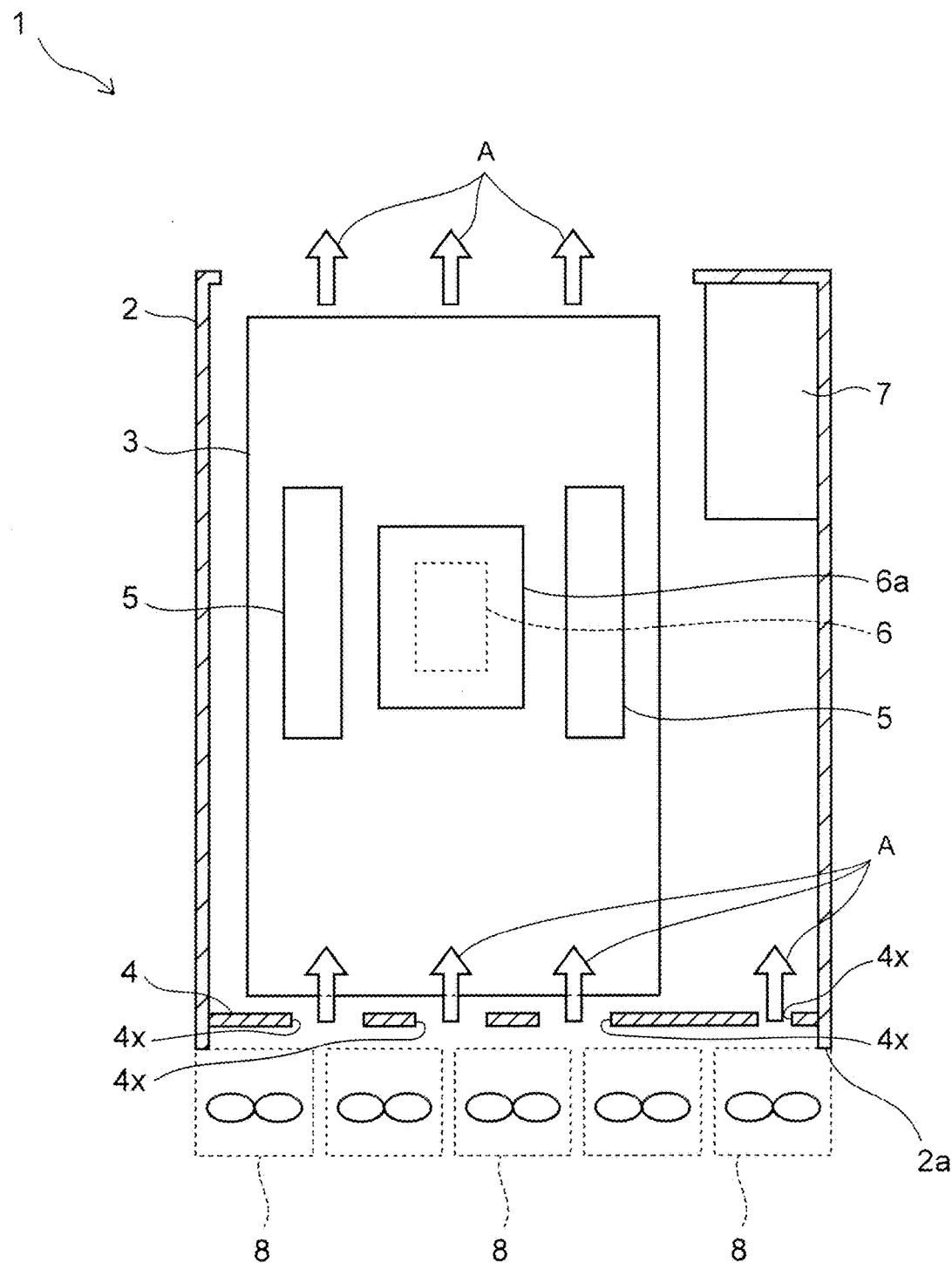
FIG. 1 is a top view of a unit device according to a first example examined by the inventor of the present application.

FIG. 1 is a top view of a unit device according to a first example examined by the inventors of the present application.

This unit device 1 is a server, for example, and includes a casing 2, a first circuit board 3 and a second circuit board 4 which are housed in the casing 2.

The first circuit board 3 is provided to lie in a horizontal plane, and a CPU as a heat generating component 6 is mounted on the first circuit board 3. In addition, a radiator 6a such as a heat sink to promote heat radiation from the heat generating component 6 is fixed on top of the heat generating component 6.

Then, first electronic components 5 such as a memory are provided around the heat generating component 6 on the first circuit board 3.

The first circuit board 3 is used as a circuit board on which to mount the first electronic components 5 and the heat generating component 6 as described above. Additionally, a power supply circuit 7 is also provided in the casing 2, and serves to supply power to the first electronic components 5 and the heat generating component 6.

Meanwhile, the second circuit board 4 is provided to stand in a vertical direction in the casing 2, and includes a plurality of openings 4x.

Then, a plurality of fans 8 is provided on a back side 2a of the casing 2, and serves to create airflows for cooling the heat generating component 6. The airflows A enter through the aforementioned openings 4x, reach the heat generating component 6, and cool the heat generating component 6.

The fans 8 and the second circuit board 4 are electrically connected to each other with unillustrated cables, and power and control signals transmitted through the cables are used to supply power to the fans 8 and to control the rotational speeds of the fans 8.

Thus, the second circuit board 4 serves to supply power and control signals to the fans 8.

Figure 2:
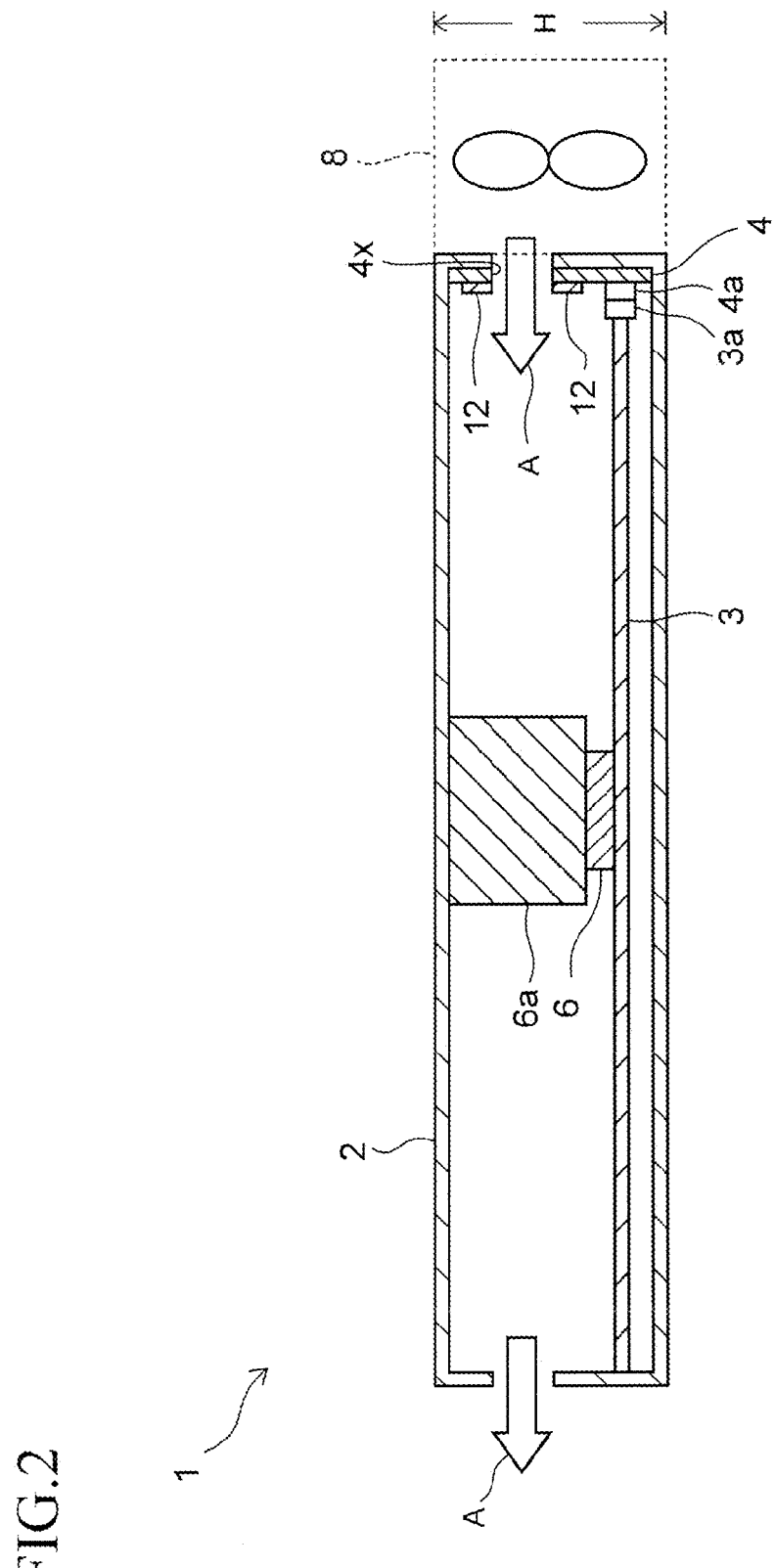
FIG. 2 is a cross sectional view of the unit device according to the first example examined by the inventor of the present application.

FIG. 2 is a cross sectional view of the unit device 1.

As illustrated in FIG. 2, a first connector 3a is provided at one end of the first circuit board 3. The first connector 3a fits in a second connector 4a provided on a surface of the second circuit board 4, whereby the first circuit board 3 and the second circuit board 4 are electrically connected to each other.

In addition, a plurality of second electronic components 12 such as a capacitor and a resistor are provided around the openings 4x on the second circuit board 4. These second electronic components 12 serve, for example, as a part of a control circuit to control the rotational speeds of the fans 8 and a power supply circuit to supply power to the fans 8.

In one conceivable structure, these second electronic components 12 may be provided on the first circuit board 3. However, since the aforementioned first electronic components 5 such as a memory are mounted at high density on the first circuit board 3, there is no room on the first circuit board 3 for mounting the second electronic components 12.

For this reason, the unit device 1 is provided with the second circuit board 4 in addition to the first circuit board 3, and the second electronic components 12 for the fans 8 are mounted on the second circuit board 4 as described above.

In another conceivable structure, the second circuit board 4 may be provided to lie in the horizontal plane as similar to the first circuit board 3. However, since most of the area in the casing 2 is occupied by the heat generating component 6, the first electronic components (see FIG. 1) and other things, there is little room for laying the second circuit board 4 in the horizontal plane inside the casing 2.

Moreover, in most cases, the height H of the unit device 1 is set to a standard height of 1 U (1.75 inches) in conformity with Electronic Industries Alliance (EIA). For this reason, it is difficult to increase the height of the casing 2 to house the second circuit board 4.

Under these circumstances, in this example, the second circuit board 4 is provided to stand in the vertical direction in the casing 2 as described above, and the openings 4x through which the airflows A can enter are provided in the second circuit board 4. Thus, the airflows A are hit against the heat generating component 6.

However, this unit device 1 is provided with only one heat generating component 6 such as a CPU, and has limitation in improvement of performance such as arithmetic processing capacity.

Second Example

The inventor of the present application also examined another unit device with the intention of improving the performance.

Figure 3:
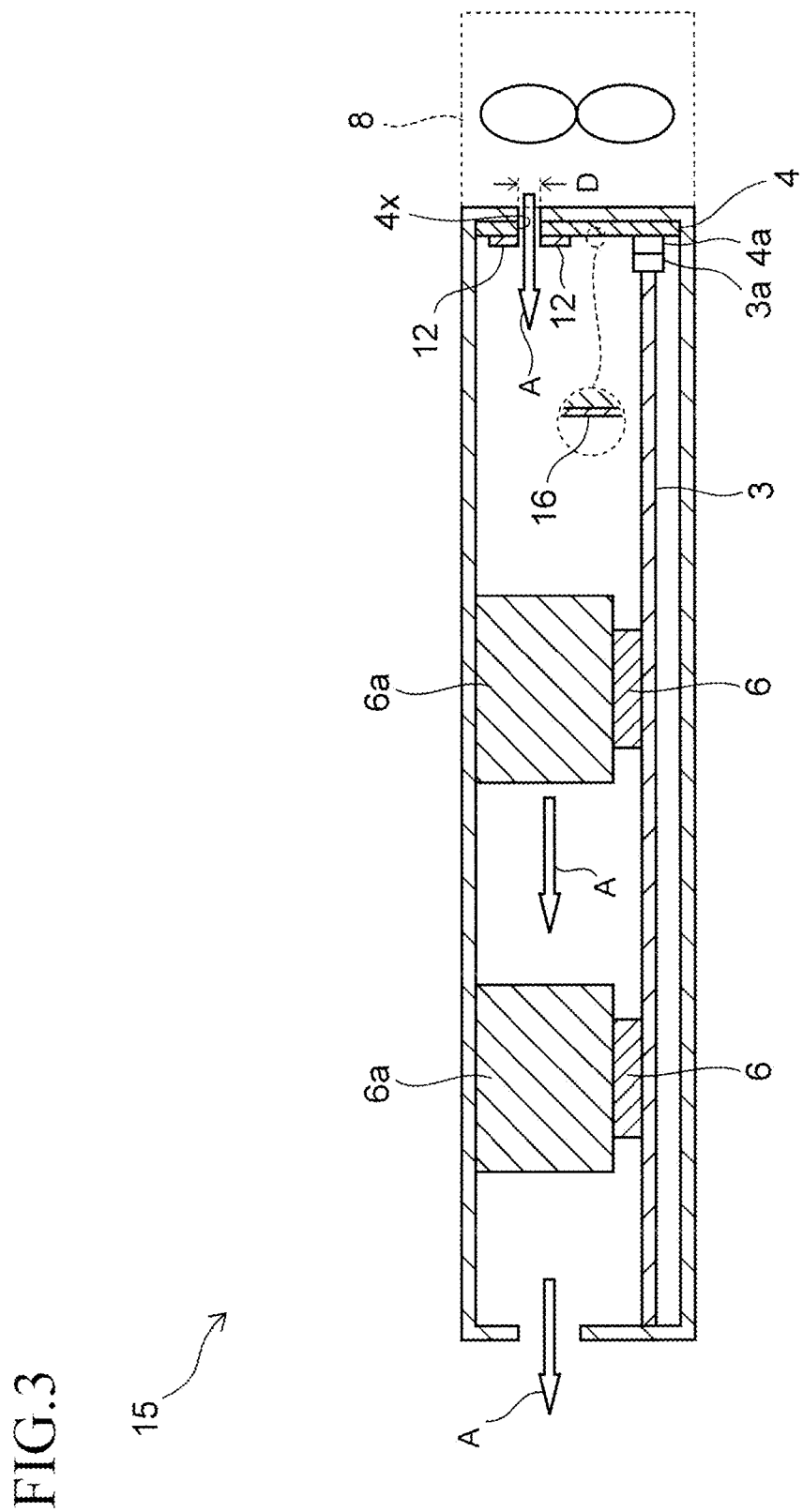
FIG. 3 is a cross sectional view of a unit device according to a second example examined by the inventor of the present application.

FIG. 3 is a cross sectional view of a unit device 15 used in the examination. In FIG. 3, the same elements as those explained in FIG. 2 are assigned with the same reference numerals as those in FIG. 2, and the explanation thereof is omitted below.

In the unit device 15, two heat generating components 6 are arranged next to each other on the first circuit board 3. There are several ways to arrange the heat generating components 6. Nevertheless, the first electronic components 5 are arranged beside the heat generating component 6 as illustrated in FIG. 1, and there is no space to mount another heat generating component 6. For this reason, in this example, the heat generating components 6 are provided on windward and leeward sides of the airflows A.

Such provision of the plurality of heat generating components 6 is considered to enable the heat generating components 6 to collaboratively perform parallel information processing, and thereby enable the unit device 15 to achieve higher performance.

In this case, the first circuit board 3 needs to be provided with wiring for electrically connecting the heat generating components 6 to each other in order that the heat generating components 6 can collaboratively perform computation. However, the first circuit board 3 has little room to route the wiring, because many first electronic components 5 are provided on the first circuit board 3.

For this reason, as illustrated in a dotted line circle of FIG. 3, wiring 16 is provided on the second circuit board 4, and the heat generating components 6 are electrically connected to each other by using the wiring 16.

In this case, however, the diameter D of the openings 4x need to be made so small that the openings 4x may not overlap the wiring 16. As a result, the air volume of the airflow A passing through each opening 4x is decreased, and accordingly efficient cooling of the heat generating components 6 is more difficult.

Moreover, the number of second electronic components 12 mounted on the second circuit board 4 may sometimes increase with an increase in the number of heat generating components 6. This makes it even more difficult to increase the diameter D of the openings 4x.

In addition, when one of the heat generating components 6 is arranged leeward of the other heat generating component 6 as in this example, the leeward heat generating component 6 is directly hit by exhaust heat from the windward heat generating component 6, and accordingly the leeward heat generating component 6 is difficult to cool.

Third Example

The inventors of the present application also examined another unit device capable of efficiently cooling heat generating components while improving the performance.

Figure 4:
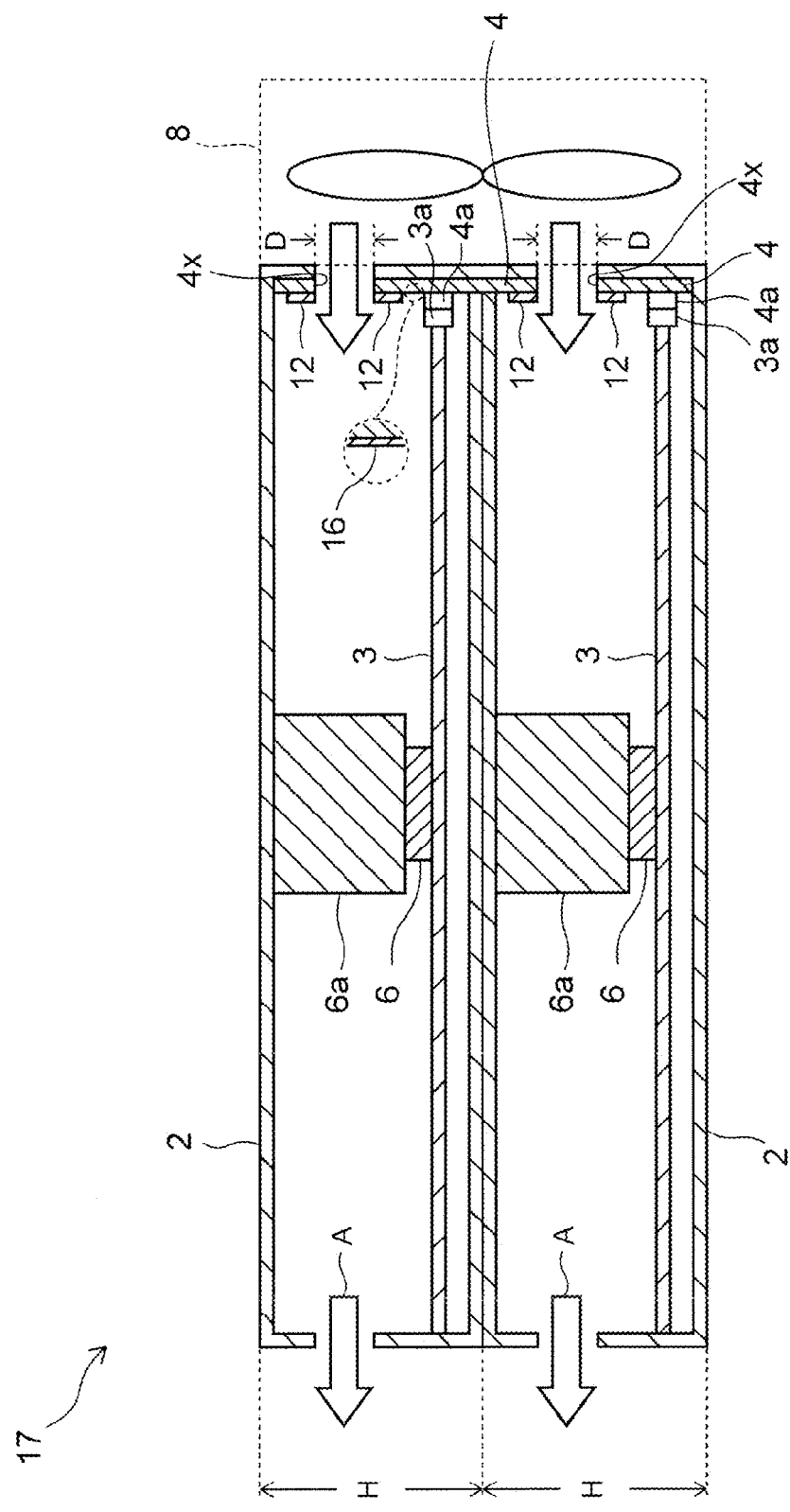
FIG. 4 is a cross sectional view of a unit device according to a third example examined by the inventor of the present application.

FIG. 4 is a cross sectional view of a unit device used in the examination.

In this unit device 17, two casings 2 each having a height H of 1 U are stacked one on top of another, and a first circuit board 3 is housed in each of the casings 2. Here, one heat generating component 6 is mounted on each of the first circuit boards 3. Also, the casings 2 share a single fan 8, and the fan 8 cools the two heat generating components 6.

Then, a second circuit board 4 is made larger than in the first example (see FIG. 2). Then, the two first circuit boards 3 are electrically connected to the second circuit board 4, and the heat generating components 6 are electrically connected to each other via wiring 16 on the second circuit board 4.

In this example, the heat generating components 6 are enabled to collaboratively perform computing as in the second example, and thus the unit device 17 can achieve higher performance.

In addition, since the second circuit board 4 is made larger as described above, the wiring 16 can be routed on the second circuit board 4 even if the diameter D of the openings 4X is made large. Consequently, the air volume of the airflows A entering through the openings 4x increases, and the airflows A can efficiently cool the heat generating components 6.

Moreover, since only one heat generating component 6 is housed in one casing 2, the unit device 17 is enabled to cool both the heat generating components 6 efficiently while avoiding a situation where the leeward heat generating component 6 is directly hit by the exhaust heat from the windward heat generating component 6 as illustrated in FIG. 3.

However, the unit device 17 including the two stacked casings 2 has a total height of 2 U, and the downsizing of the unit device 17 is failed.

Hereinafter, embodiments are described for a unit device which is enabled to hit a large volume of air against a plurality of heat generating components while being kept from increasing in size.

First Embodiment

The present and following embodiments are described by taking a server as an example of a unit device.

Figure 5:
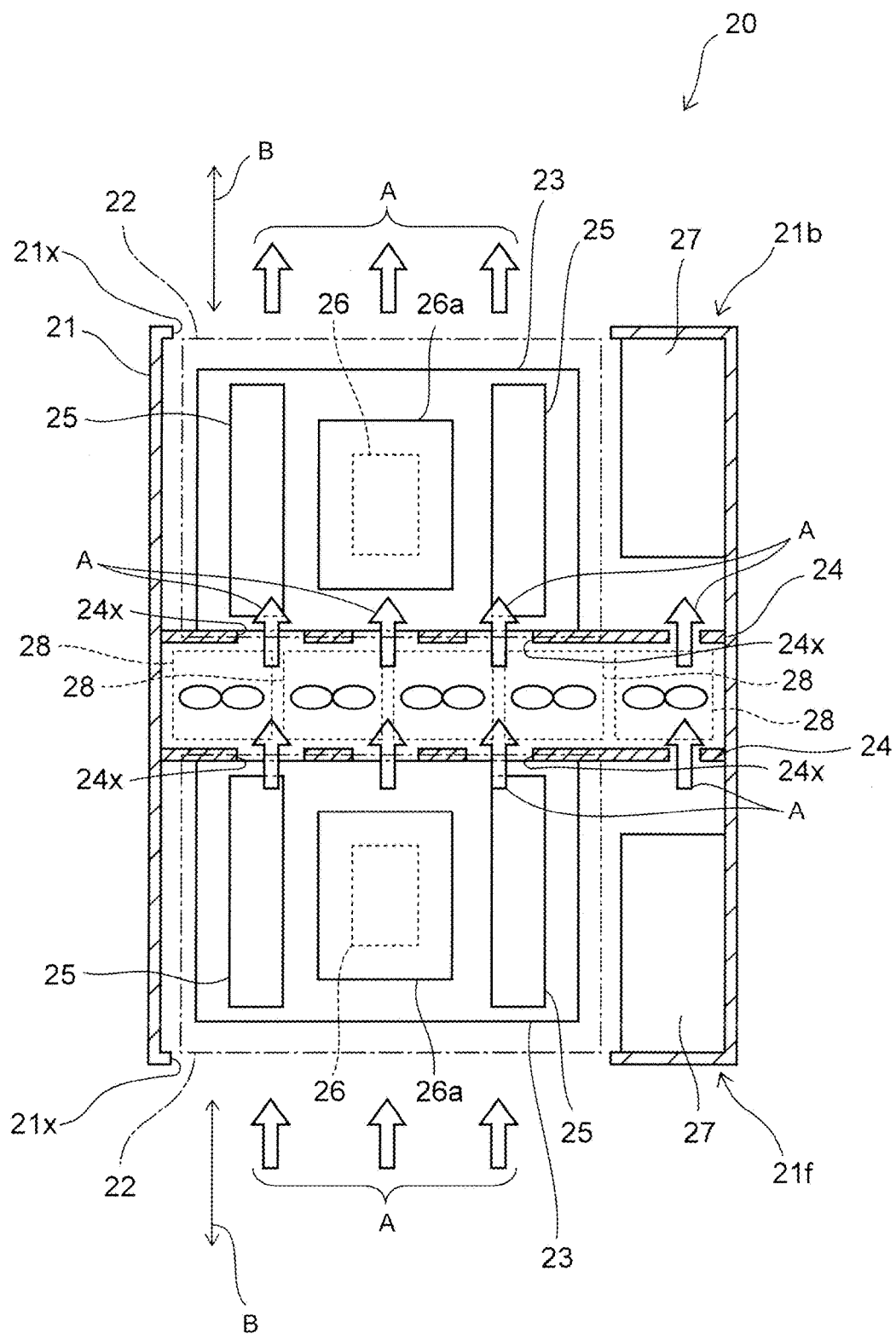
FIG. 5 is a top view of a unit device according to a first embodiment.

FIG. 5 is a top view of a unit device according to the present embodiment.

This unit device 20 includes a casing 21 and two sub-units 22 housed in the casing 21.

Among them, the casing 21 includes a front surface 21*f* and a back surface 21*b*. Then, the two sub-units 22 are configured to collaboratively perform information processing, and are freely detachably attachable to the casing 21 from the front surface 21*f* and from the back surface 21*b* along directions of arrow B.

The sub-units 22 each include a heat generating component 26 such as a CPU for performing information processing, and a first circuit board 23 on which the heat generating component 26 is mounted. Here, a heat sink is fixed on top of the heat generating component 26, and the heat sink serves as a radiator 26*a* for promoting heat radiation of the heat generating component 26.

Both the first circuit boards 23 are laid in a horizontal plane, and are arranged apart from each other in top view. Moreover, first electronic components 25 such as a memory are mounted around each of the heat generating components 26 on the first circuit boards 23.

The first circuit board 23 in each sub-unit 22 is used as a circuit board on which to mount the first electronic components 25 and the heat generating component 26 in this manner. Moreover, in the casing 21, power supply circuits 27 are also provided to supply power to the first electronic components 25 and the heat generating components 26.

Then, two second circuit boards 24 each including a plurality of openings 24*x* are provided between these sub-units 22, and arranged to stand at a distance from each other. In addition, a plurality of fans 28 is provided between these two second circuit boards 24.

The fans 28 create airflows A by drawing air from the openings 24*x* in one of the two second circuit boards 24, and expelling the air from the openings 24*x* in the other second circuit board 24, and thereby the airflows A cool both the two heat generating components 26.

Note that the front surface 21*f* and the back surface 21*b* of the casing 21 are provided with openings 21*x* for drawing and expelling the airflow A.

The structure of the plurality of sub-units 22 is not partially limited. However, when the sub-units 22 employ respectively different structures, the design cost of the sub-units 22 increases. For this reason, in this example, the plurality of sub-units 22 employ the same structure, and thus the design cost for the unit device 20 is reduced.

Figure 6:
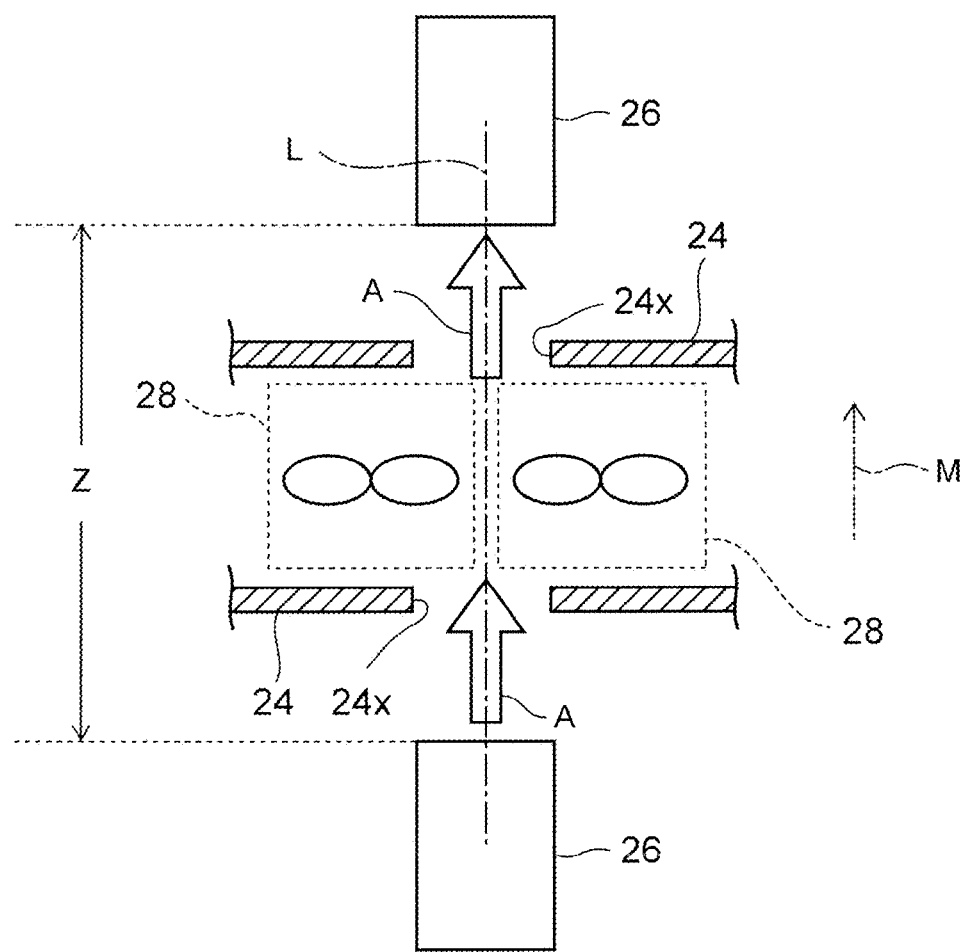
FIG. 6 is an enlarged plan view illustrating a positional relationship between two heat generating components in the first embodiment.

FIG. 6 is an enlarged plan view illustrating a positional relationship between the two heat generating components 26.

As illustrated in FIG. 6, in present embodiment, an imaginary line L connecting the two heat generating components 26 to each other is arranged in parallel with an axial direction M of the fans 28. In this arrangement, the heat generating component 26 located on the leeward side of the airflows A is hit by exhaust heat from the heat generating component 26 on the windward side of the airflow A. However, in the present embodiment, the fans 28 and the second circuit boards 24 are present between the two heat generating components 26, and hence a distance Z between the heat generating components 26 becomes wide. Thus, unlike the example of FIG. 3, the leeward heat generating component 26 is less warmed by the exhaust heat from the windward heat generating component 26, and cooling of the leeward heat generating component 26 is less hindered.

Figure 7:
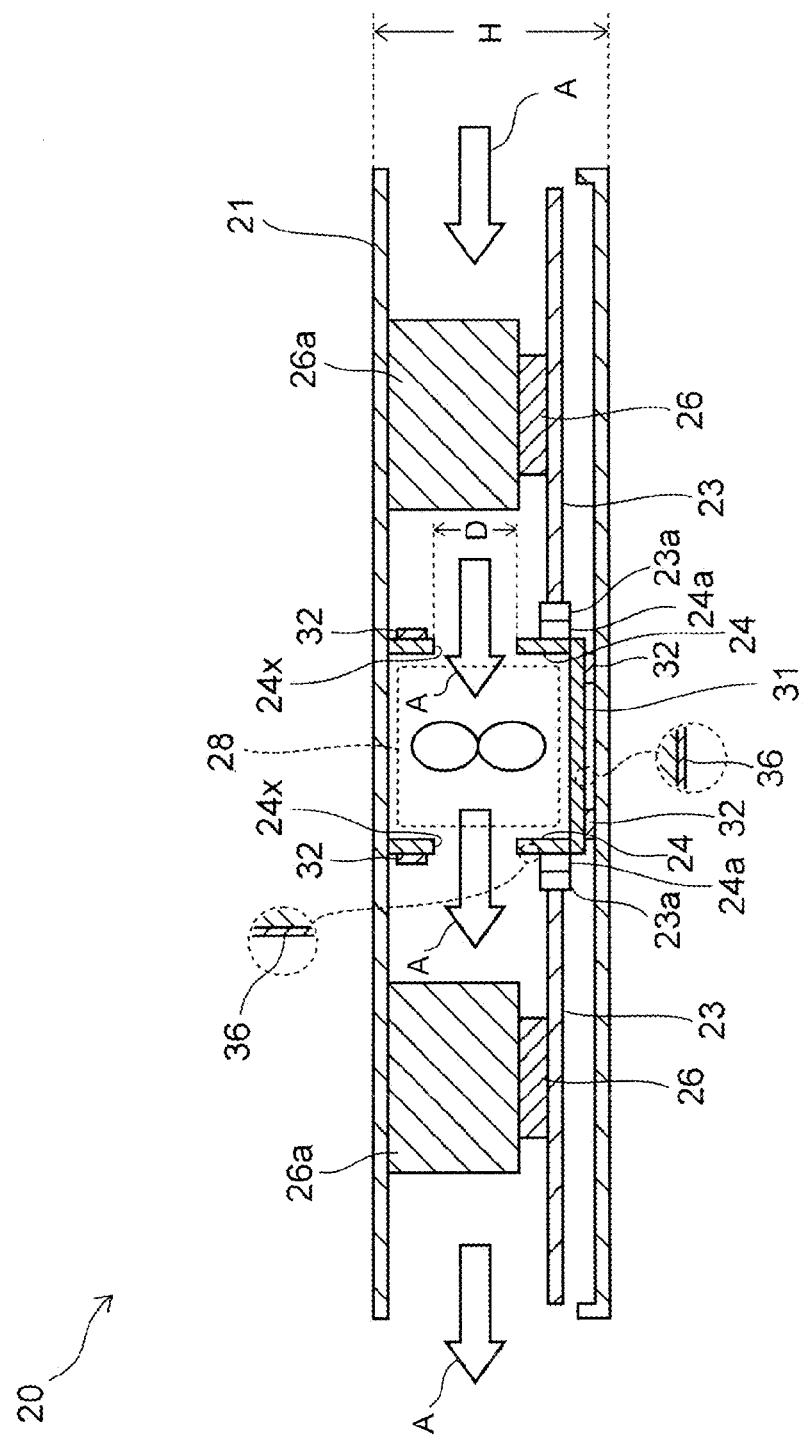
FIG. 7 is a cross sectional view of the unit device according to the first embodiment.

FIG. 7 is a cross sectional view of the unit device according to the present embodiment.

As illustrated in FIG. 7, in the present embodiment, the two heat generating components 26 are arranged at a distance from each other in the horizontal direction. This arrangement keeps the height H of the unit device 20 at 1 U, and prevents an increase of the height H to 2 U as in the example in FIG. 4 where the heat generating components 26 are stacked in the height direction.

In addition, a first connector 23*a* is provided at one end of each of the first circuit boards 23. The first connector 23*a* fits in a second connector 24*a* provided on the corresponding second circuit board 24, whereby each pair of the corresponding circuit boards 23, 24 are electrically connected to each other.

Then, a connecting plate 31 is provided to lie in a horizontal plane between the two second circuit boards 24, and the connecting plate 31 serves to electrically connect these second circuit boards 24 to each other. The structure of the connecting plate 31 is not particularly limited. In this example, a wiring substrate is used as the connecting plate 31.

The two second circuit boards 24 and the connecting plate 31 are fabricated separately. After completion of the fabrication, the two second circuit boards 24 and the connecting plate 31 are electrically connected with an unillustrated connector or the like to be substantially U-shaped in cross sectional view eventually.

Note that it is preferable to employ the same structure for the two second circuit boards 24 for the purpose of reducing the design cost.

Further, a plurality of second electronic components 32 such as capacitors and resistors are mounted on surfaces of the second circuit boards 24 and the connecting plate 31. These second electronic components 32 constitute, for example, a part of a control circuit to control the rotational speeds of the fans 28 and a power supply circuit to supply power to the fans 28.

In addition, as illustrated in dotted line circles in FIG. 7, wiring 36 is provided on the second circuit boards 24 and the connecting plate 31. The wiring 36 serves to electrically connect the two heat generating components 26 to each other, whereby the two heat generating components can perform parallel information processing while communicating with each other, and the unit device 20 can achieve higher performance.

According to the present embodiment described above, two second circuit boards 24 are provided, and hence the total surface area of the second circuit boards 24 becomes larger than in the case where only one second circuit board 24 is provided. Thus, the second circuit boards 24 have more room to route the wiring 36.

Accordingly, it is possible to increase the diameter D of the openings 24x while avoiding overlapping of the openings 24x with the wiring 36. This increases the air volume of the airflows A passing through the openings 24x, and enables the large volume of the airflows A to hit both the two heat generating components 26.

Moreover, the wiring 36 is formed also on the connecting plate 31. This allows the second circuit boards to have even more room to route the wiring 36, and accordingly makes it easier to increase the size of the openings 24x.

In addition, even if an increased number of second electronic components 32 are provided for two heat generating components 26 provided in the casing 21, the second electronic components 32 can be distributed among the two second circuit boards 24 and the connecting plate 31. As a result, the second electronic components 32 and the openings 24x hardly overlap each other.

Still further, the two heat generating components 26 are arranged apart in the horizontal direction, and are not arranged apart in the height direction. Therefore, the height H of the unit device 20 is kept at 1 U, and the unit device 20 is kept from increasing in size.

Second Embodiment

In the first embodiment, the imaginary line L connecting the two heat generating components 26 is arranged in parallel with the axial direction M of the fans 28 as illustrated in FIG. 6.

In contrast, in the present embodiment, the positions of heat generating components 26 are changed as described below, so that cooling efficiency of the heat generating components 26 can be enhanced.

Figure 8:
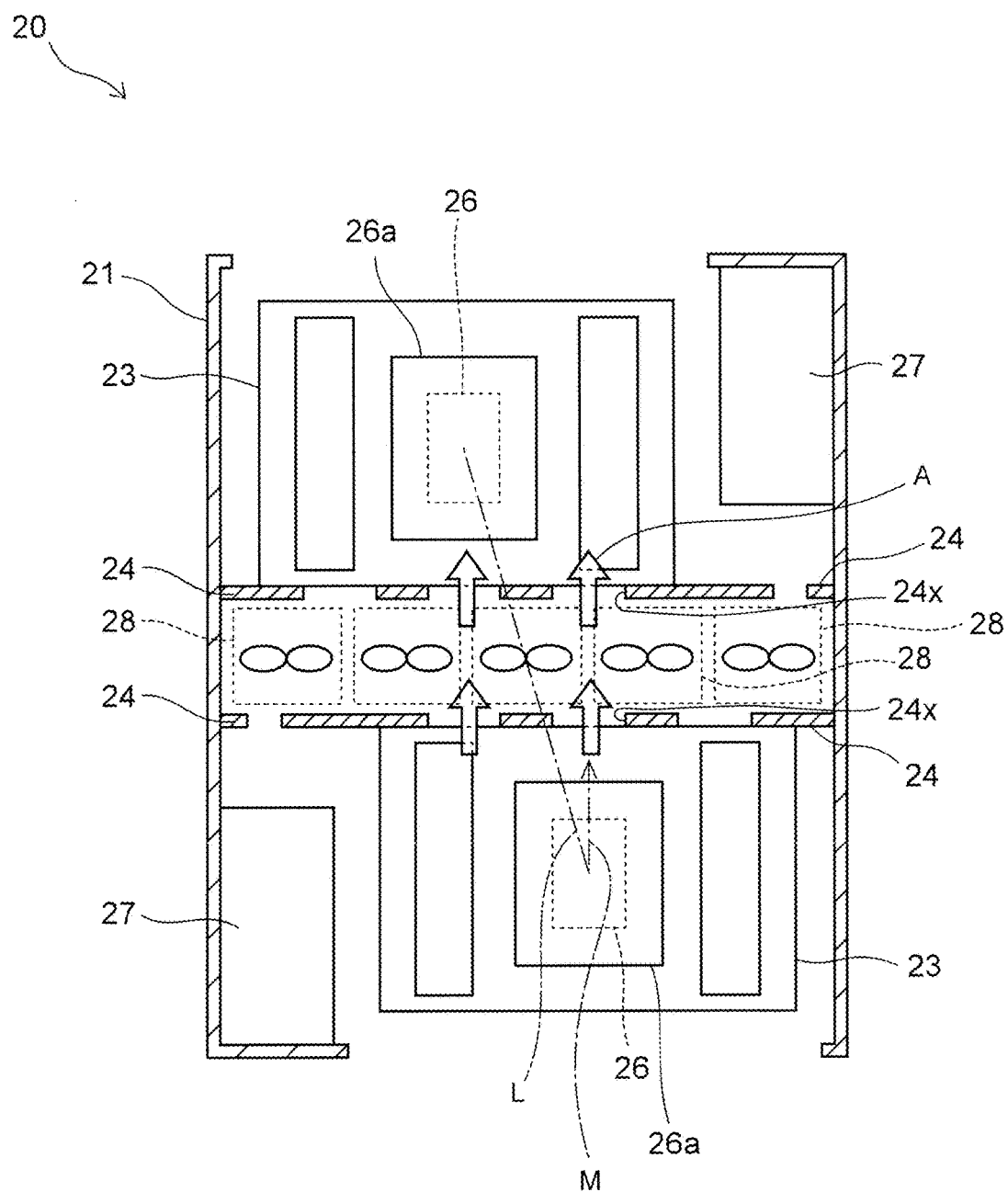
FIG. 8 is a top view of a unit device according to a second embodiment.

FIG. 8 is a top view of a unit device 20 according to the present embodiment.

In FIG. 8, the same elements as those explained in the first embodiment are assigned with the same reference numerals as those in the first embodiment, and the explanation thereof is omitted below.

As illustrated in FIG. 8, in the present embodiment, an imaginary line L connecting two heat generating components 26 to each other is inclined with respect to an axial direction M of fans 28.

With this structure, the heat generating component 26 on the leeward side of the airflow A is less warmed by the exhaust heat from the heat generating component 26 on the windward side of the airflow A. Thus, the leeward heat generating component 26 can be cooled efficiently.

Third Embodiment

In the first embodiment, the number of sub-units 22 included in a single unit device 20 is two as illustrated in FIG. 5. In the present embodiment, the number of sub-units 22 is increased to more than two.

Figure 9:
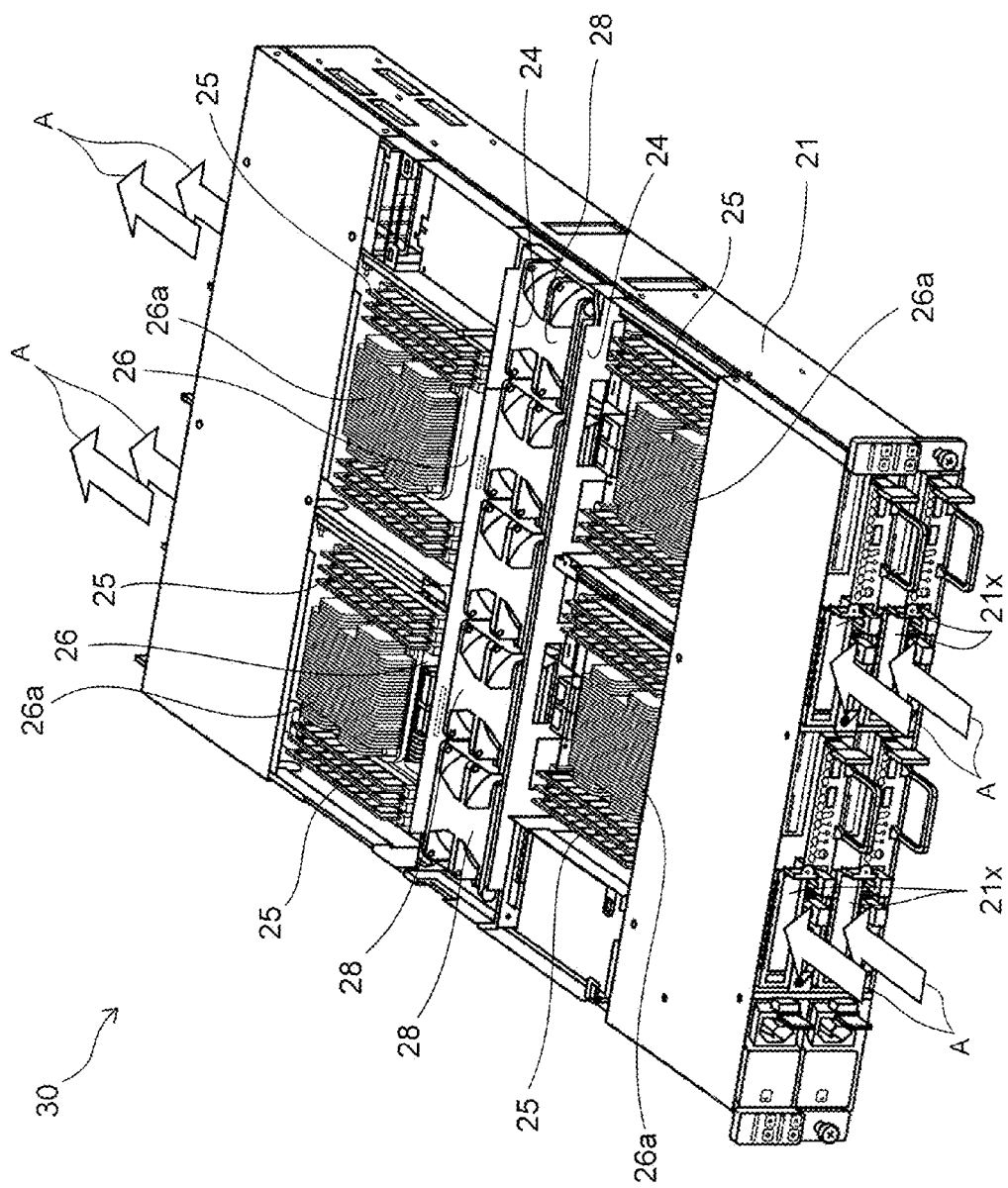
FIG. 9 is a cross sectional view of a unit device according to a third embodiment.

FIG. 9 is a perspective view of a unit device 30 according to the present embodiment.

In FIG. 9, the same elements as those explained in the first embodiment are assigned with the same reference numerals as those in the first embodiment, and the explanation thereof is omitted below.

As illustrated in FIG. 9, also in the present embodiment, two second circuit boards 24 are arranged to stand at a distance from each other in a casing 21, and a plurality of fans 28 are also provided between these second circuit boards 24.

When the fans 28 are rotated, airflows A are drawn into the casing 21 through openings 21x of the casing 21.

Figure 10:
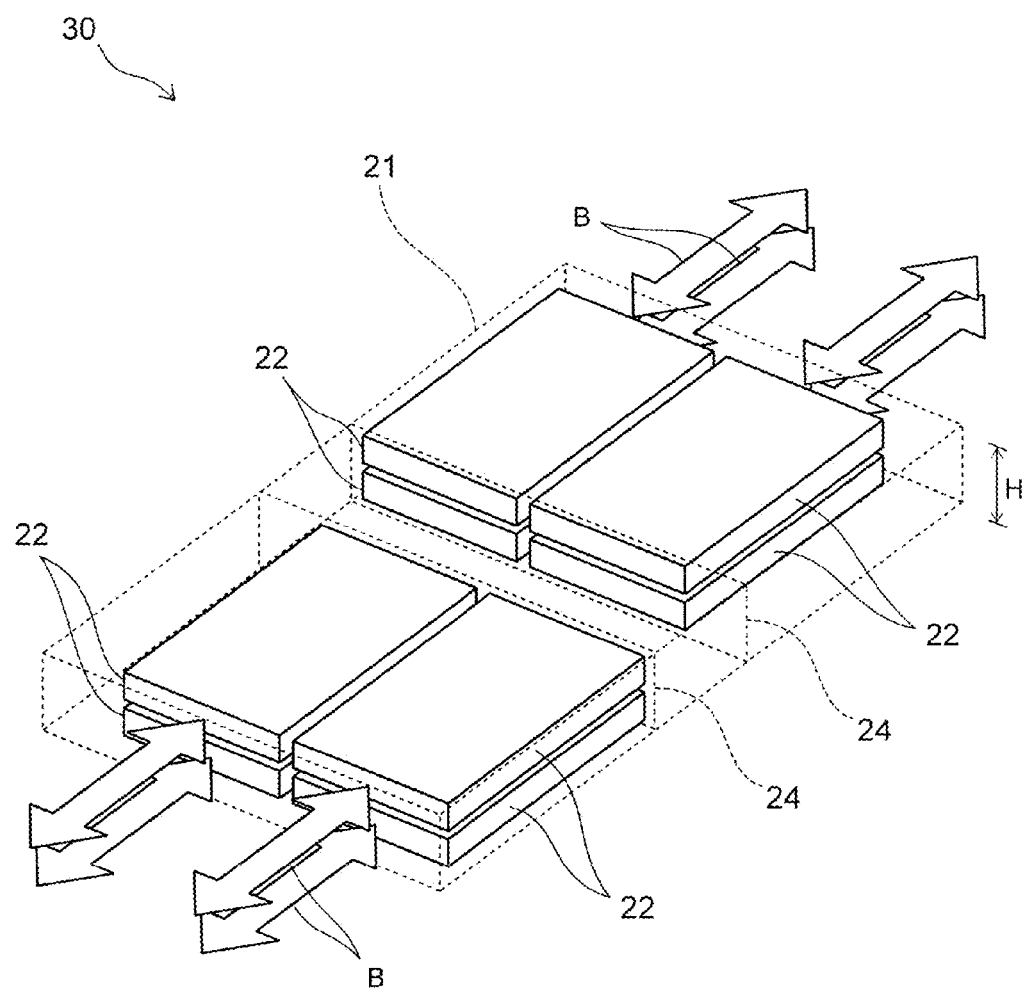
FIG. 10 is a schematic perspective view illustrating a structure of the unit device according to the third embodiment.

FIG. 10 is a schematic perspective view illustrating a structure of this unit device 30.

As illustrated in FIG. 10, in the present embodiment, the sub-units 22 are stacked in two tiers each including four sub-units 22, and thus a total number of sub-units 22 housed in the casing 21 is eight.

Here, each of the eight sub-units 22 is freely detachably attached to the casing 21 along directions of arrow B, and is electrically connected to any of the two circuit boards 24 via connectors 23a, 24a (see FIG. 7).

According to the present embodiment, the performance of the unit device 30 is further enhanced because the number of sub-units 22 housed in one casing 21 is larger than in the first embodiment.

Figure 11:
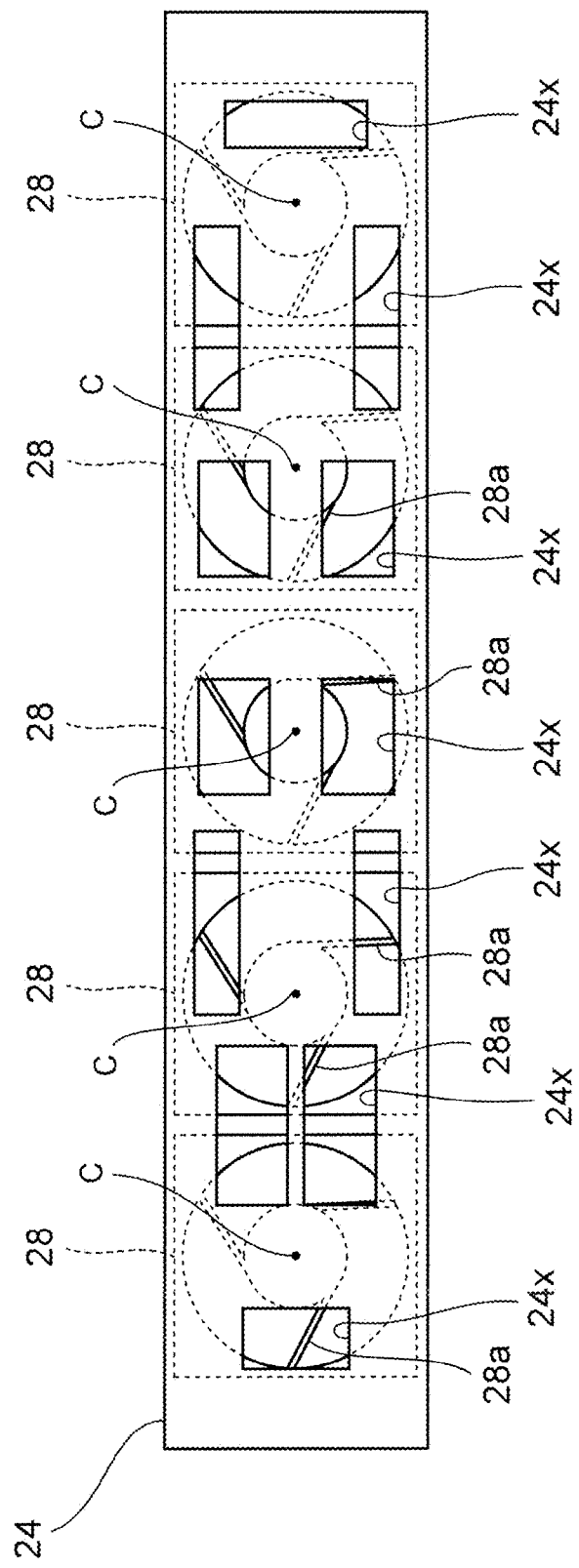
FIG. 11 is a front view of a second circuit board and fans used in the third embodiment.

FIG. 11 is a front view of the second circuit board 24 and the fans 28 used in the present embodiment.

As illustrated in FIG. 11, each of the fans 28 includes blades 28a that rotate about a rotation axis C. In the present embodiment, the blades 28a and the openings 24x are arranged to overlap each other in front view.

This arrangement allows strong airflows A (see FIG. 9) created by the blades 28a to efficiently pass through the openings 24x.

In this case, it is preferable that the openings 24x be located off the rotation axes C of the fans 28 in front view. At a portion of the fan 28 near the rotation axis C, there is only an unillustrated motor for driving and rotating the fan 28 while there are no blades 28a for creating an airflow A, and the airflow A is weak. For this reason, rather than uselessly increasing the openings 24x in size, locating the openings 24x off the rotation axes C as described above results in a higher wind speed of the airflows A getting in and out of the openings 24x.

Figure 12:
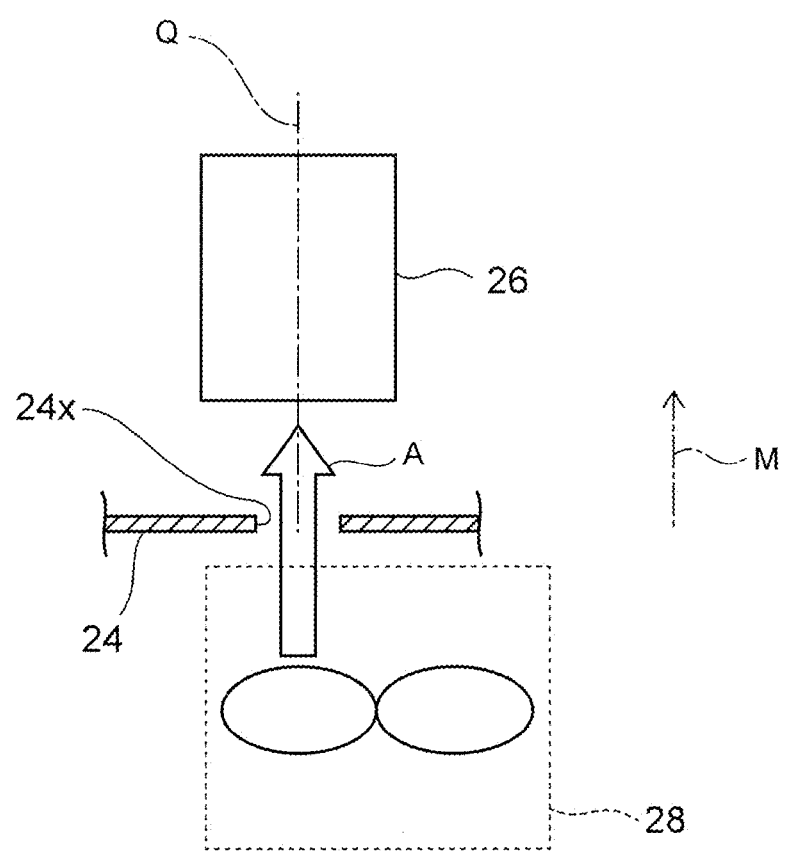
FIG. 12 is an enlarged top view schematically illustrating a positional relationship between an opening and a heat generating component in the third embodiment.

FIG. 12 is an enlarged top view schematically illustrating a positional relationship between the opening 24x and the heat generating component 26.

As illustrated in FIG. 12, the heat generating component 26 is located on an imaginary straight line Q extending from the opening 24x in an axial direction M of the fan 28.

This arrangement allows most of the airflow A getting in and out of the opening 24x to hit the heat generating component 26, and thereby the airflow A to efficiently cool the heat generating component 26.

Fourth Embodiment

In the first embodiment, the wiring substrate is used as the connecting plate 31 electrically connecting the two second circuit boards 24 as described with reference to FIG. 7. In the present embodiment, another example of the connection plate 31 is described.

Figure 13:
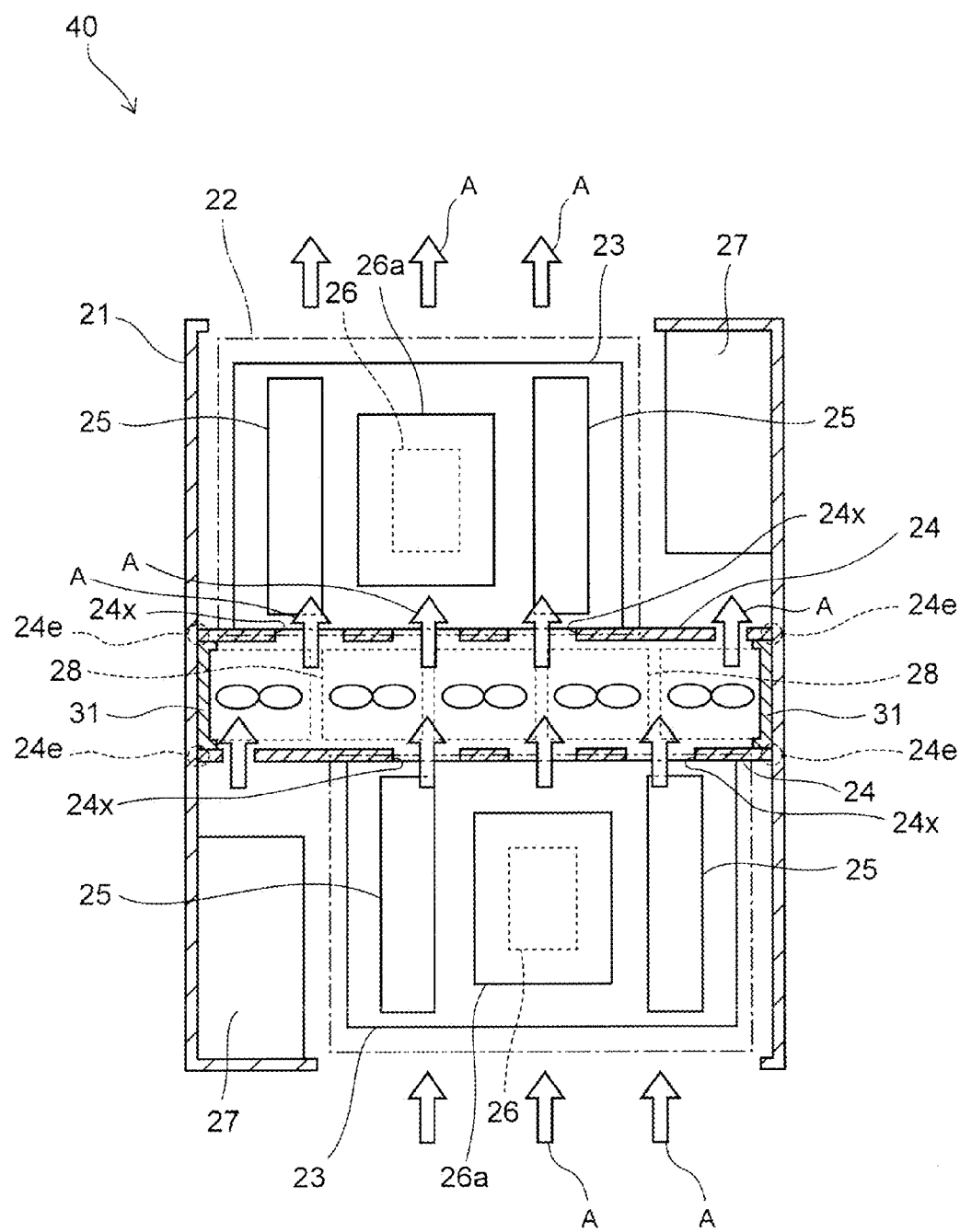
FIG. 13 is a top view of a unit device according to a fourth embodiment.

FIG. 13 is a top view of a unit device according to the present embodiment.

As illustrated in FIG. 13, in the unit device 40, ends 24e of two second circuit boards 24 are electrically connected to each other with a connecting plate 31, and a conductor plate such as a copper plate is used as the connecting plates 31.

With this structure, two heat generating components are able to communicate with each other via the connecting plates 31 and the second circuit boards 24, and to perform information processing collaboratively in parallel.

Figure 14:
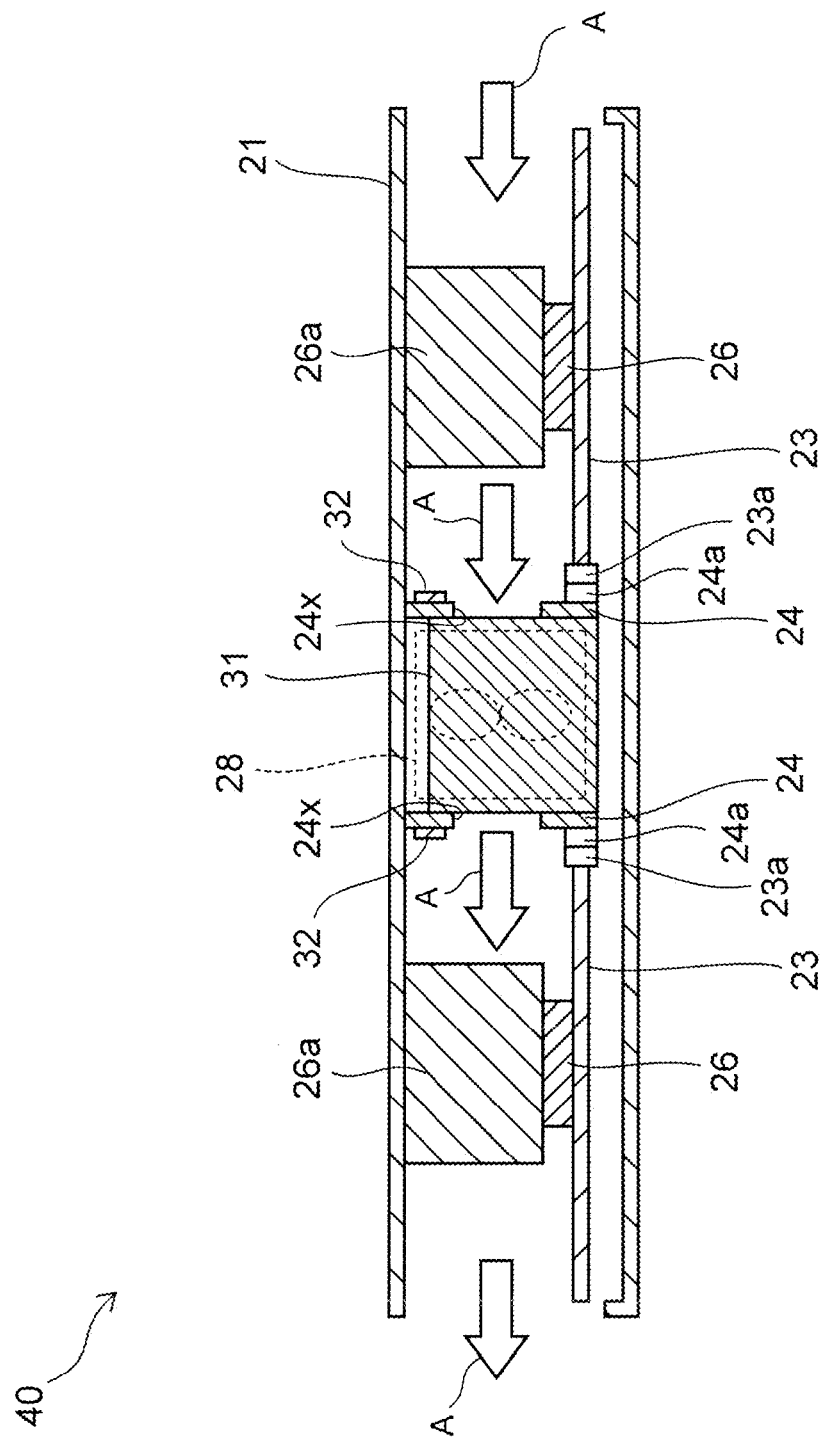
FIG. 14 is a cross sectional view of the unit device according to the fourth embodiment.

FIG. 14 is a cross sectional view of the unit device according to the present embodiment.

As illustrated in FIG. 14, in the present embodiment, the connecting plates 31 are arranged to stand in a casing 21.

This arrangement eliminates the necessity to secure a space where the connecting plate 31 can be laid in a horizontal plane below the first circuit boards 23, and therefore enables the two second circuit boards 24 to be electrically connected to each other with the connecting plates 31, even if the space below the first circuit boards 23 in the casing 21 has no room.

All examples and conditional language provided herein are intended for the pedagogical purpose of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention has been described in detail, it should be understood that the various changes, substitutions, and alterations could be made hereto without departing from the spirit and scope of the invention.

What is claimed is:

1. A unit device comprising:
   two first circuit boards provided apart from each other in a same horizontal plane;
   a heat generating component provided on each of the two first circuit boards;
   two second circuit boards on surfaces of which electronic components are mounted, provided between the two first circuit boards, arranged to stand at a distance from each other and to be opposed to each other on the same horizontal plane, and having a first opening of one of the two second circuit boards adjacent to one of the two first circuit boards and a second opening of the other one of the two second circuit boards adjacent to the other one of the two first circuit boards, the first opening and the second opening which are located at a higher position than the same horizontal plane; and
   a fan provided between the two second circuit boards and configured to cool the heat generating component on each of the two first circuit boards by drawing air through the first opening and by expelling the air through the second opening,
   an axial direction is a direction parallel to a rotation axis of the fan,
   a surface of the one of the two second circuit boards and a surface of the other one of the two second circuit boards face in the axial direction,
   the fan includes blades around the rotation axis,
   any one of the blades and the first opening overlap each other when the one of the two second circuit boards is viewed in the axial direction on the side of the one of the two first circuit boards, and
   any one of the blades and the second opening overlap each other when the other one of the two second circuit boards is viewed in the axial direction on the side of the other one of the two first circuit boards.

2. The unit device according to claim 1, further comprising a connecting plate electrically connecting the two second circuit boards to each other.

3. The unit device according to claim 2, wherein
   the connecting plate is provided to lie in a horizontal plane, and
   the connecting plate and the two second circuit boards are substantially U-shaped in cross sectional view.

4. The unit device according to claim 2, wherein the connecting plate is provided to lie in a vertical plane.

5. The unit device according to claim 1, wherein the first opening is located off the rotation axis of the fan in the front view when the one of the two second circuit boards is viewed in the axial direction on the side of the one of the two first circuit boards, and the second opening is located off the rotation axis of the fan when the other one of the two second circuit boards is viewed in the axial direction on the side of the other one of the two first circuit boards.

6. The unit device according to claim 1, further comprising:
   a casing that houses the first circuit board, the second circuit board, and the fan, wherein
   one of the first circuit boards and the heat generating component provided on the one first circuit board constitute a sub-unit detachably attachable to the casing, and
   a plurality of the sub-units are detachably attached to the casing.

7. The unit device according to claim 6, wherein the plurality of sub-units have a same structure.

8. The unit device according to claim 1, wherein the heat generating component on the one of the two first circuit boards is located on an imaginary straight line extending from the first opening in the axial direction, and the heat generating component on the other one of the two first circuit boards is located on an imaginary straight line extending from the second opening in the axial direction.

9. The unit device according to claim 8, wherein an imaginary straight line connecting the heat generating component on the one of the two first circuit boards and the heat generating component on the other one of the two first circuit boards is inclined with respect to the axial direction of the fan.

10. The unit device according to claim 8, wherein an imaginary straight line connecting the heat generating component on the one of the two first circuit boards and the heat generating component on the other one of the two first circuit boards is parallel to the axial direction of the fan.

11. The unit device according to claim 1, further comprising a connector provided on the one of the two second circuit boards to electrically connect to the one of the two first circuit boards and the other connector provided on the other one of the two second circuit boards to electrically connect to the other one of the two first circuit boards.

* * * * *